US011307229B2

(12) United States Patent
Beck et al.

(10) Patent No.: US 11,307,229 B2
(45) Date of Patent: Apr. 19, 2022

(54) POWER DAEMON

(71) Applicant: RAMOT AT TEL-AVIV UNIVERSITY LTD., Tel Aviv (IL)

(72) Inventors: Yuval Beck, Tel Aviv (IL); Ram Machlev, Tel Aviv (IL)

(73) Assignee: Ramot at Tel-Aviv University Ltd., Tel Aviv (IL)

( * ) Notice: Subject to any disclaimer, the term of this patent is extended or adjusted under 35 U.S.C. 154(b) by 584 days.

(21) Appl. No.: 16/200,679

(22) Filed: Nov. 27, 2018

(65) Prior Publication Data

US 2019/0162762 A1     May 30, 2019

Related U.S. Application Data

(60) Provisional application No. 62/590,670, filed on Nov. 27, 2017.

(51) Int. Cl.
*G01R 21/133* (2006.01)
*G01R 21/00* (2006.01)
(Continued)

(52) U.S. Cl.
CPC ......... *G01R 21/133* (2013.01); *G01R 21/006* (2013.01); *G01R 21/007* (2013.01);
(Continued)

(58) Field of Classification Search
CPC .. G01R 21/133; G01R 21/006; G01R 21/007; H04Q 9/00; H04Q 9/02; H04Q 2209/84; H04Q 2209/60
See application file for complete search history.

(56) References Cited

U.S. PATENT DOCUMENTS

2012/0072141 A1* 3/2012 Hidai ............... G01R 22/10
702/60
2013/0338948 A1* 12/2013 Zeifman ........... G01R 21/133
702/60

(Continued)

FOREIGN PATENT DOCUMENTS

CN         104578157 A  *  4/2015

OTHER PUBLICATIONS

White, D.J., "The maximization of a function over the efficient set via a penalty function approach," 1995, European Journal of Operation Research 94, 143-153 (Year: 1995).*

*Primary Examiner* — Tarun Sinha
*Assistant Examiner* — Yossef Korang-Beheshti
(74) *Attorney, Agent, or Firm* — A.C. Entis—IP Ltd.; Allan C. Entis

(57) ABSTRACT

Apparatus for disaggregating a plurality of aggregated electrical devices that receive power via a same power node, the apparatus comprising: a memory having values of at least one power feature for each of the aggregated electrical devices that characterizes power consumption of the device; and a processor configured to: receive a measure of a value for the at least one power feature of node power distributed to the aggregated devices via the power node; determine an optimum probability mass function (PMF) based on the values for the at least one power feature for each of the electrical devices that is optimized to provide an optimum disaggregation state vector for the aggregated electrical devices that satisfies a predetermined criterion to provide a value for the at least one power feature that agrees with the received measure of the at least one power feature.

17 Claims, 3 Drawing Sheets

(51) Int. Cl.
*H04Q 9/02* (2006.01)
*H04Q 9/00* (2006.01)

(52) U.S. Cl.
CPC ............... *H04Q 9/00* (2013.01); *H04Q 9/02* (2013.01); *H04Q 2209/60* (2013.01); *H04Q 2209/84* (2013.01)

(56) References Cited

U.S. PATENT DOCUMENTS

2018/0307997 A1* 10/2018 Escobedo Hernandez ................. G06N 7/005
2019/0026660 A1* 1/2019 Yabe ...................... G06Q 10/04

* cited by examiner

POWER DAEMON

RELATED APPLICATIONS

The present application claims the benefit under 35 U.S.C. 119(e) of U.S. Provisional Application 62/590,670, filed on Nov. 27, 2017, the disclosure of which is incorporated herein by reference.

FIELD

Embodiments of the disclosure relate to monitoring power consumption of electrical devices that receive power via a same electrical power distribution point.

BACKGROUND

For numerous reasons, as global society increases in size and complexity, monitoring energy consumption of electrical devices has become of greater interest and importance. Monitoring electrical equipment to determine whether they are ON or OFF and how much energy they are respectively consuming when ON is relevant not only for managing energy consumption, but also for detecting when consumption or patterns of consumption are anomalous. Anomalies in energy consumption of an electrical device may by way of example, indicate a device malfunction, unusual demand for a functionality that the device provides, unauthorized or prohibited use of the device, and/or a breach of cyber security.

Whereas, it is generally impractical to couple a power monitor to each individual piece of equipment in an enterprise or domestic home to receive and process a flow of power usage signals from each device most electrical devices are grouped, also referred to as aggregated, to share with other electrical devices a same power distribution junction, also referred to as a power node, via which they all receive electrical power. For example, groups of electrical equipment in a same factory may be aggregated in a power distribution network to receive power via a same power node. And appliances in a same home are typically aggregated to receive electrical power via a same power node, a power meter, in the house at which power from power plant distribution lines enter the house. For such aggregated devices, in lieu of direct monitoring power consumption of each individual device, methods referred to as Non-invasive Load Monitoring (NILM) methods have been developed for inferring which aggregated devices receiving power from a same power node are ON and receiving power from the power node, and which of the aggregated devices are OFF and not drawing power from the power node.

In NILM, total aggregated electrical power, also referred to as electrical node power or node power, distributed to a plurality of aggregated devices from a same power node is sampled at the node and the sample measurements processed by suitable algorithms to infer which of the aggregated devices connected to the power node is ON, and which are OFF at a given time. Inferring which of the aggregated devices are ON and which devices are OFF may be referred to as disaggregating the power consumption of the devices, or simply, disaggregating the power or the devices.

SUMMARY

An aspect of an embodiment of the disclosure relates to providing a NILM module, hereinafter also referred to as a "Power Daemon", configured to receive a measurement of at least one feature, hereinafter also referred to as a power feature, of electrical node power distributed at a given time by a power node to an aggregation of electrical devices, and process the measurement to disaggregate the devices for the at least one power feature and given time.

In an embodiment, the Power Daemon operates to determine an optimum probability mass function (PMF) for the electrical devices, that is optimized to provide an expected pattern of respective ON and OFF (ON/OFF) states of the devices that provides a value for the at least one power feature of the node power that agrees with the measurement of the at least one node power feature. The PMF is determined to be optimized and provide a value that agrees with the measurement if the PMF satisfies a predetermined optimization criterion or a set of predetermined optimization criteria. A pattern of ON/OFF device states provided by a PMF that disaggregates the electrical devices for the at least one power feature may be referred to as a disaggregation or disaggregation state of the aggregated devices.

In an embodiment, the Power Daemon determines an optimum PMF and a corresponding ON/OFF optimum disaggregation state for the at least one power feature by iterating a trial PMF for the aggregated devices to minimize a power feature cost function having a value that is a function of the trial PMF. The value for the cost function for a given power feature may comprise an absolute value of a difference between the value of the measurement acquired for the at least one power feature of node power, and a trial value for the at least one node power feature based on a trial disaggregation state provided by the trial PMF. The trial value for a given trial PMF may be determined based on a predetermined value for the at least one power feature exhibited by power consumption for each of the device states that a device of the aggregated devices may assume when ON. In an embodiment, the cost function comprises a penalty function that is a function of a trial disaggregation state for the aggregated devices based on the trial PMF, and an optimum disaggregation state of the aggregated devices determined for a time prior to a time at which the given measurement is acquired. Optionally, the penalty function is a function of a measure of a difference between the trial disaggregation state and the optimum disaggregation state for the prior time. Optionally, the penalty function is weighted inversely by a time lapse between times for which the trial disaggregation state and the prior, optimum, disaggregation state are determined. A trial PMF is accepted as an optimum PMF if the trial PMF satisfies the optimization criteria.

In an embodiment, the at least one power feature comprises at least one or any combination of more than one of current, apparent power (VA), real power (W), reactive power (VAR), power factor, total harmonic distortion (THD), total demand distortion, and/or an amplitude of a component of an integral transform of the power feature.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical features that appear in more than one figure are generally labeled with a same label in all the figures in which they appear. A label labeling an icon representing a given feature of an embodiment of the invention in a figure may be used to reference the given feature. Dimensions of features shown in the figures are chosen for convenience and clarity of presentation and are not necessarily shown to scale.

DETAILED DESCRIPTION

In the following detailed description, a Power Daemon in accordance with an embodiment of the disclosure is described and discussed with respect to FIG. 1, which schematically shows the Power Daemon monitoring and disaggregating an aggregation of household appliances. A method by which a Power Daemon, such as that shown in FIG. 1, may operate to monitor and disaggregate an aggregation of electrical devices is described with reference to a flow diagram shown in FIG. 2.

In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment for an application for which the embodiment is intended. Wherever a general term in the disclosure is illustrated by reference to an example instance or a list of example instances, the instance or instances referred to, are by way of non-limiting example instances of the general term, and the general term is not intended to be limited to the specific example instance or instances referred to. Unless otherwise indicated, the word "or" in the description and claims is considered to be the inclusive "or" rather than the exclusive or, and indicates at least one of, or any combination of more than one of items it conjoins.

Figure 1:
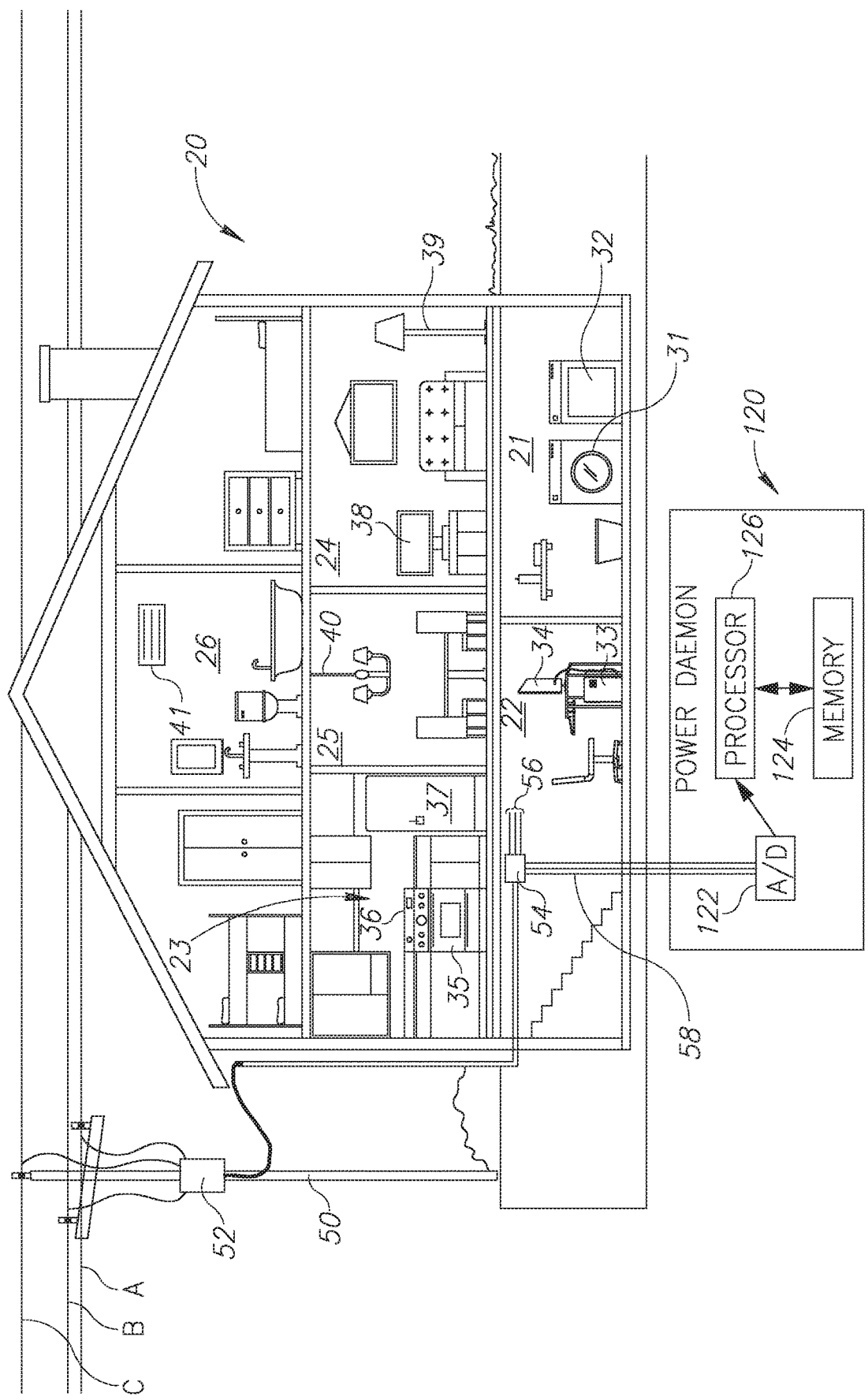
FIG. 1 schematically shows a Power Daemon monitoring an aggregation of electrical appliances in a home, in accordance with an embodiment of the disclosure.

FIG. 1 shows a schematic cutaway image of a house 20 and a Power Daemon 120 monitoring power provided to the house in accordance with an embodiment of the disclosure. House 20 optionally has a plurality of rooms containing various household appliances. Among the appliances in the house are by way of example, a washing machine 31 and dryer 32 located in a cellar room 21, a computer 33 and display screen 34 in a cellar study 22, and in a kitchen 23 an oven 35, electric stove-top burner 36 and a refrigerator 37. A living room 24 has a TV 38 and a standing lamp 39. A dining room 25 includes a ceiling light fixture 40. A bathroom 26 is shown having an electric wall heater 41. A given appliance in house 20 may be either ON or OFF, and an appliance may have a plurality of different states in which it may be ON and for which power features, such as a portion of apparent power consumed that is active power, characterizing power consumed by the appliance when ON, may be different. The various appliances in house 20 may be referenced by a subscripted variable "$D_n$", $1 \leq n \leq N$, where each subscript n indicates a different appliance, and N is a total number of the appliances in the house.

House 20 may receive single phase or polyphase electrical power, and as schematically shown in FIG. 1, optionally three phase polyphase power from three, overhead high voltage power lines A, B, and C that are supported by a utility pole 50. Optionally, electrical power is provided from power lines A, B, and C to a transformer 52, which reduces the high voltage of power received from the power lines to a household voltage and delivers three phase household voltage to a power meter 54 in house 20 for power distribution to appliances $D_n$. Meter 54 distributes three phase power to electrical appliances $D_n$ of house 20 via three household power lines 56 and measures the amount of distributed power provided to the appliances. Appliances $D_n$ receiving power via a same power distribution node, power meter 54, are aggregated appliances.

Power Daemon 120 optionally comprises an analog to digital converter (A/D) 122, a memory 124 storing data and processor executable instructions useable to disaggregate power in accordance with an embodiment of the disclosure, and a processor 126 operable to execute the instructions and use the data to disaggregate power. The data and executable instructions may collectively be referred to as software. Memory 124 may have any electronic and/or optical circuitry suitable for storing data and/or computer executable instructions and may, by way of example, comprise any one or any combination of more than one of a flash memory, random access memory (RAM), read only memory (ROM), and/or erasable programmable read-only memory (EPROM). Processor 126 may comprise any electronic and/or optical processing and/or control circuitry useable to provide and enable functionalities of Power Daemon 120 and may by way of example comprise any one, or any combination of more than one of, a microprocessor, an application specific circuit (ASIC), field programmable array (FPGA) and/or system on a chip (SOC).

Whereas Power Daemon 120 is schematically shown in FIG. 1 as a single unit it may be a distributed apparatus, and/or may be at least partially cloud based and comprise at least one wire or wireless communications interface such as a WiFI, Bluetooth, or mobile communications network interface, that enables the Power Daemon to communicate with and access data and/or functionalities from an external source, such as optionally the cloud that may be advantageous to support Power Daemon performance. For example, Power Demon 120 may communicate with the cloud to download to memory 124 specification updates for appliances $D_n$ and/or to download or outsource algorithms advantageous for processing data related to power consumption of appliances $D_n$ that the Power Daemon acquires.

As schematically shown in FIG. 1, Power Daemon 120 is connected to meter 54 optionally by wires 58. In an embodiment A/D 122 receives, optionally analog, signals via wires 58 that are functions of power provided by wires 56 to household appliances $D_n$, samples and converts the analog signals to digital signals, and transmits the digital signals for processing to processor 126. Processor 126 uses software in memory 124 to process the signals and disaggregate appliances $D_n$ and provide an optimum disaggregation state for the devices for at least one power feature of appliances $D_n$.

Let an appliance $D_n$ have M(n) states, $1 \leq M(n)$, in which the appliance may be ON or OFF and a probability $p_{n,m}$ of $D_n$ being ON in an m-th state, $1 \leq m \leq M(n)$, during which the appliance consumes electrical power distributed via meter 54. A probability distribution for $D_n$ being ON or OFF in the m-th state may therefore be represented by a probability mass distribution (PMF) of a random Bernoulli variable $s_{n,m}(p_{n,m})$, which assumes values 1 and 0 to represent ON and OFF states respectively of $D_n$. Variable $s_{n,m}(p_{n,m})$ assumes a value $s_{n,m}=1$ with probability $p_{n,m}$ and a value $s_{n,m}=0$ with probability $(1-p_{n,m})$. It is assumed that an appliance $D_n$ cannot be ON in more than one state at a time so that if for a given state m=m', $s_{n,m'}=1$, then for a state m≠m', $s_{n,m}=0$.

At a given time t a pattern of ON/OFF appliances $D_n$ that indicates which appliances $D_n$ in house 20 are ON and which are OFF may be represented by a disaggregation state vector S(t) having components that are the values $s(t)_{n,m}$ assumed by random variables $s_{n,m}(p_{n,m})$ at time t. Disaggregation state vector S(t) may be generated by vectorizing the tensor components $s(t)_{n,m}$ so that in symbols, $$S(t)=\{s(t)_{1,1}, s(t)_{1,2}, \ldots, s(t)_{1,M(1)}, s(t)_{2,1}, \ldots s(t)_{2,M(2)}, \ldots s(t)_{N,1}, \ldots s(t)_{N,M(N)}\} \quad (1)$$

An ON/OFF state of the aggregated appliances $D_n$ described by a given disaggregation state vector S(t) may be referred to as an ON/OFF state S(t), a disaggregation state S(t), or a state S(t), of the $D_n$. A probability of appliances $D_n$ being in a state S(t) is given by a probability mass distribution function PMF($p_{n,m}$) determined by the set $\{p_{n,m}, 1 \le n \le N, 1 \le m \le M(n)\}$ and the constraint that a given $D_n$ can be ON in only one state m at a given time.

Let $pw(f)_{n,m}$ represent a value of a power feature, a device power feature, designated by an index f, $1 \le f \le F$, of F power features that may be used to characterize power consumption of an appliance $D_n$ when appliance $D_n$ is ON in a state m and consuming power distributed via meter 54. A power feature f may for example, be a measure of apparent power, active power (actual power consumed), reactive power, or power consumption at a particular frequency that characterizes consumption of power by appliance $D_n$. A device power feature value $pw(f)_{n,m}$ may for example be stored in memory 124 and/or in a cloud based memory accessible by Power Daemon 120 via a communications interface that the Power Daemon optionally comprises. Let PW(f,t) represent a value of the given power feature f, for power, that is, node power, distributed via meter 54 to aggregated appliances $D_n$ in house 20 at time t. Then, if for the given power feature f, PW(f,t) is a linear function of the $pw(f)_{n,m}$, PW(f,t) may be given by an expression, $$PW(f,t)=\Sigma_{n,m} pw(f)_{n,m} s(t)_{n,m}. \quad (2)$$

If pw(f) represents a vector for the given power feature f generated by vectorizing components $pw(f)_{n,m}$, $1 \le n \le N$, $1 \le m \le M$ so that $$pw(f)=\{pw(f)_{1,1}, pw(f)_{1,2} \ldots pw(f)_{1,M(1)}, pw(f)_{2,1} \ldots pw(f)_{2,M(2)}, pw(f)_{N,1} \ldots pw(f)_{N,M(N)}\} \quad (3)$$

then expression (2) may be written as the scalar product of vectors S(t) and pw(f), $$PW(f,t)=S(t) \cdot pw(f). \quad (4)$$

Whereas in expressions (2) and (4) PW(f,t) is assumed to be a scalar, electrical power provided house 20 via meter 54 may be characterized by a power feature vector, PW(t), having components that are values PW(f,t) of a plurality of power features f so that PW(t) may be given by an expression:

$$PW(t)=\{PW(f,t)|(1 \le f \le F)\}=\{PW(1,t), PW(2,t), PW(3,t), \ldots PW(F,t)\}. \quad (5)$$

Similarly, power consumption of an appliance $D_n$ when ON in a given state m may be characterized by values of a set of power features f that define a power feature vector $pw_{n,m}$, which may be given by an expression, $$pw_{n,m}=\{pw_{n,m}(1), pw_{n,m}(2), pw_{n,m}(3), \ldots pw_{n,m}(F)\}. \quad (6)$$

Let $\Phi$ represent a matrix for which the columns are transposes of the vectors $pw_{n,m}$ defined in expression (6) so that $\Phi$ is a matrix:

$$\Phi = \begin{pmatrix} pw_{1,1}(1) & pw_{1,2}(1) & \ldots & pw_{2,1}(1) & \ldots & pw_{N,M}(1) \\ pw_{1,1}(2) & pw_{1,2}(2) & \ldots & pw_{2,1}(2) & \ldots & pw_{N,M}(2) \\ \vdots & \vdots & & \vdots & \ddots & \vdots \\ pw_{1,1}(F) & pw_{1,2}(F) & \ldots & pw_{2,1}(F) & \ldots & pw_{N,M}(F) \end{pmatrix} \quad (7)$$

Assuming again that PW(t) is a linear function of the power feature vectors $pw_{n,m}$, then PW(t) may be determined by a matrix equation, $$PW(t)=(x\,S(t)^\dagger, \quad (8)$$

where † indicates the transpose.

Figure 2A:
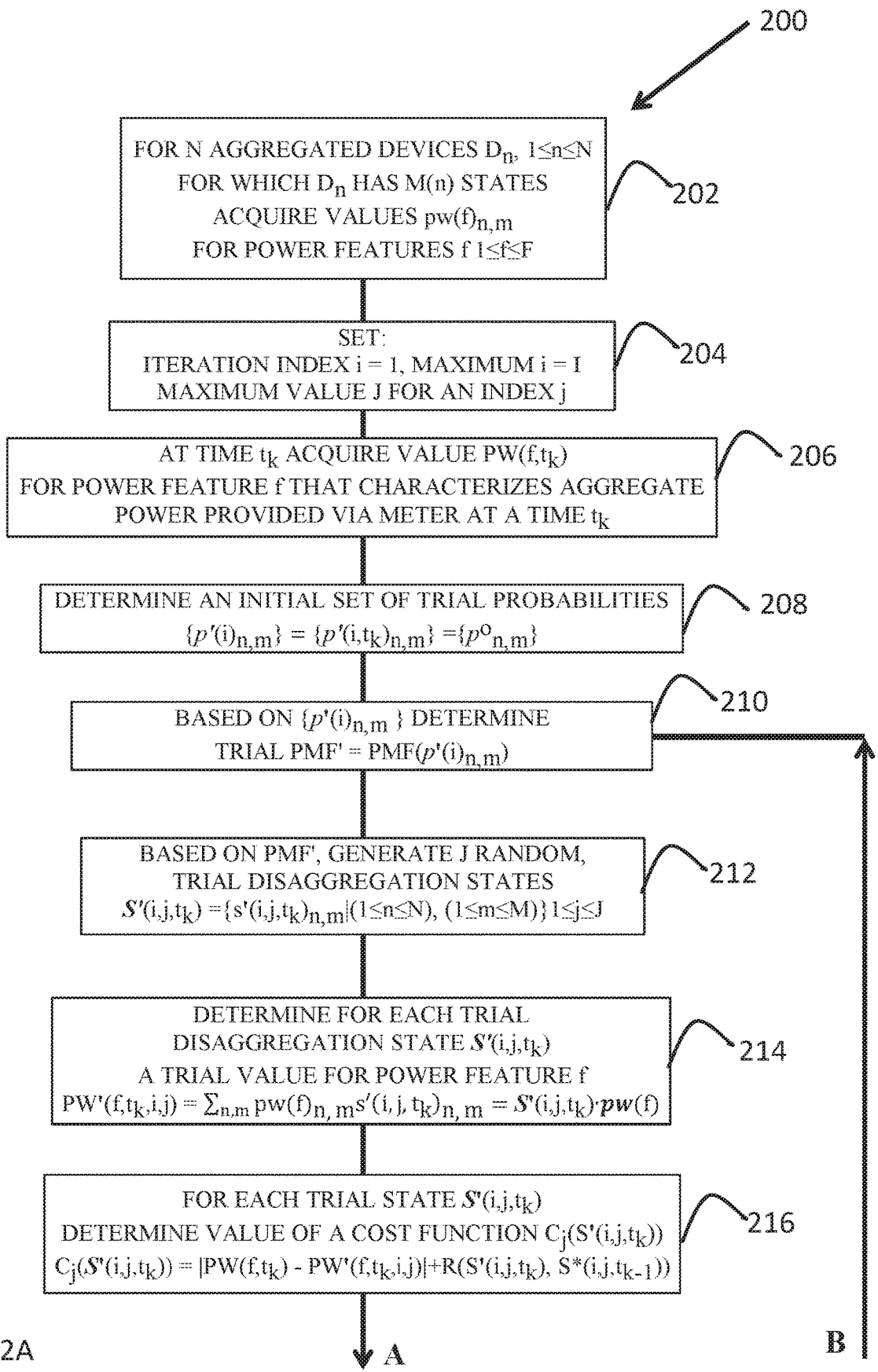
FIGS. 2A-2B show an algorithm by which the Power Daemon shown in FIG. 1 operates to monitor and disaggregate an aggregated plurality of electrical devices in accordance with an embodiment of the disclosure.
Figure 2B:
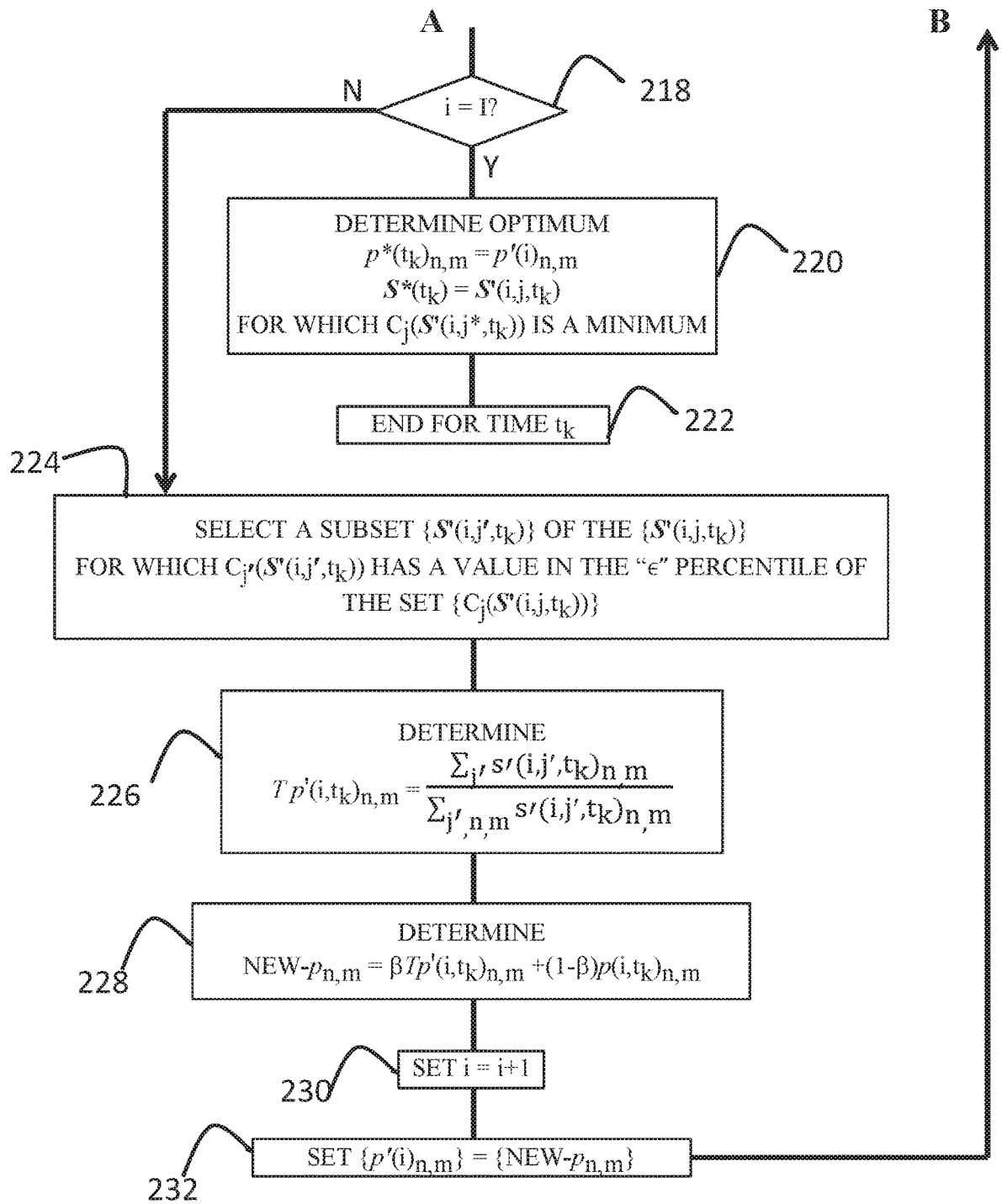

In an embodiment Power Daemon 120, is configured to determine optimum values, $p^*_{n,m}$ for the probabilities $p_{n,m}$ and therefrom an optimum state vector S*(t) which disaggregates appliances $D_n$ for a time t from a measurement of PW(f,t) or PW(t). FIGS. 2A and 2B show a flow diagram of an iterative cross-entropy procedure 200 that Power Daemon 120 may execute to disaggregate an aggregate of appliances $D_n$ in accordance with an embodiment of the disclosure. In the discussion of FIGS. 2A and 2B and in the figures, optimum scalar and vector quantities are indicated by an asterisk, *, added to symbols representing the quantities. Trial values for scalar and vector quantities are indicated by a prime '.

In a block 202 of procedure 200 Power Daemon 120 optionally acquires values for $pw(f)_{n,m}$ $1 \le n \le N$, $1 \le m \le M(n)$, for the $D_n$ for at least one power feature f, $1 \le f \le F$. In a block 204 the Power Daemon may set an iteration index "i" equal to one, a maximum I for index i and a number of iterations, and a maximum J for an index j. Optionally, in a block 206 the Power Daemon acquires a value PW(f,$t_k$) for at least one power feature f that characterizes power provided to house 20 via meter 54 at a time $t_k$. In a block 208 the Power Daemon determines initial trial values $p'(i)_{n,m}=p^\circ_{n,m}$ for probabilities $p_{n,m}$ of Bernoulli variables $s_{n,m}(p_{n,m})$. In an embodiment, the initial trial values $p^\circ$ n,m are the same for all indices n and m. Optionally a sum $Q=\Sigma_{m=1}^{m=M(n)} p^\circ_{n,m}$ is the same for all n and for a given n, $p^\circ_{n,m}=Q/M(n)$. In an embodiment, initial values $p^\circ_{n,m}$ for time $t_k$ may be responsive to optimum values determined for probabilities $p_{n,m}$ for a time previous to time $t_k$. For example, initial trial values $p^\circ_{n,m}$ may be biased based on corresponding optimum probabilities $p^*_{n,m}$. By way of a specific example, an initial value $p^\circ_{n,m}$ determined in accordance with a given criterion may be biased up or down by a given bias percentage if a corresponding $p^*_{n,m}$ is substantially equal respectively to 1 or 0. A bias percentage may be less than or equal to about 10%, or about 20%.

In an embodiment, in a block 210 Power Daemon 120 may determine a trial probability mass function PMF' for probability of occurrence of a given ON/OFF disaggregation state of appliances $D_n$ based on the trial values $p'(i)_{n,m}$ determined in block 208, or as discussed below, determined in a block 232. In a block 212, Daemon 120 uses the trial PMF' to generate a plurality of, J, trial disaggregation state vectors, $$S'(i,j,t_k)=\{s'(i,j,t_k)_{n,m}|(1 \le n \le N),(1 \le m \le M),1 \le j \le J\}. \quad (9)$$

In expression (9) $s'(i,j,t_k)_{n,m}$ is a trial value for trial disaggregation state vector $S'(i,j,t_k)$ of the Bernoulli appliance state variable $s_{n,m}(p_{n,m})$ for iteration i, time $t_k$, appliance $D_n$, and appliance state m. In a block 214 Power Daemon 120 may determine a trial value PW'(f,$t_k$,i,j) for at least one power feature PW(f,$t_k$) for each trial disaggregation state S'(i,j,$t_k$). A trial power feature PW'(f,$t_k$,i,j) may be written, $$PW'(f,t_k,i,j)=\Sigma_{n,m}pw(f)_{n,m}s'(i,j,t_k)_{n,m}=S'(i,j,t_k)\cdot pw(f) \quad (10)$$

For a case in which Power Daemon 120 processes a power feature vector PW(t) defined in expression (5) and having components PW(f,$t_k$) (1≤f≤F) a trial power feature vector may be defined by an expression similar to expression (5)

$$PW'(f,t_k,i,j)=\Phi \times S'(i,j,t_k)^\dagger \quad (11)$$

Optionally, in a block 216 Power Daemon 120 determines for each trial state S'(i,j,$t_k$) a value for a cost function $C_j$(S'(i,j,$t_k$)). In an embodiment cost function $C_j$(S'(i,j,$t_k$)) is a function of an absolute difference between measured power feature PW(f,$t_k$) for at least one power feature f acquired in block 206 and trial power feature PW'(f,$t_k$,i,j) determined for the at least one power feature. For a case in which Power Daemon 120 processes a power feature vector PW(t), the cost function $C_j$(S'(i,j,$t_k$)) may be a function of a magnitude of a vector difference between PW(f,$t_k$) and PW'(f,$t_k$,i,j), or weighted differences between components of PW(f,$t_k$) and PW'(f,$t_k$,i,j).

Optionally, the cost function is a function of a penalty "R". In an embodiment R may increase the value of cost function $C_j$(S'(i,j,$t_k$)) with increase in a function of difference between a trial disaggregation state vector S'(i,j,$t_k$) and an optimum disaggregation state vector, for a time previous to time $t_k$. The function may by way of example comprise a Hamming distance, or a sum, or function thereof of weighted differences between components of S'(i,j,$t_k$) and corresponding components of an optimum disaggregation state vector. Optionally the function of the difference, comprises a function of a difference between a trial power feature PW'(f,$t_k$,i,j) or power feature vector PW'(f,$t_k$,i,j) and an optimum power feature or power feature vector respectively for a time previous to time $t_k$. Optionally the function of the difference, comprises a function of a sum of weighted differences between components of PW'(f,$t_k$,i,j) and corresponding components of an optimum power feature vector for a time previous to time $t_k$. Optionally, the previous time is a last time $t_{k-1}$ relative to time $t_k$ at which an optimum disaggregation state vector S*(i,j,$t_k$) is determined for appliances $D_n$. Cost function $C_j$(S'(i,j,$t_k$)) may be given by an expression, $$C_j(S'(i,j,t_k))=|PW(f,t_k)-PW'(f,t_k,i,j)|+R(S'(i,j,t_k),S^*(i,j,t_{k-1})) \quad (12)$$

for a scalar PW(f,$t_k$), and, optionally, for a vector PW(f,$t_k$)

$$C_j(S'(i,j,t_k))=|PW(f,t_k)-PW'(f,t_k,i,j)|+R(S'(i,j,t_k),S^*(i,j,t_{k-1})). \quad (13)$$

In a decision block 218 Power Daemon 120 determines whether or not iteration index i is equal to the maximum, I. If (i=I), Power Daemon 120 may proceed to a block 220 to determine optimum values for appliance probabilities p*($t_k$)$_{n,m}$, and an optimum disaggregation state vector S*($t_k$) in accordance with expressions, $$p^*(t_k)_{n,m}=p'(i)_{n,m} \quad (14)$$

$$S^*(t_k)=S'(i,j^*,t_k). \quad (15)$$

In expression (15) S'(i,j*,$t_k$) may be a j*-th trial disaggregation state vector of the J trial disaggregation state vectors generated in block 212 that provides a smallest value of the J cost function values $C_j$(S'(i,j,$t_k$)) (1≤j≤J) determined in block 216.

In accordance with an embodiment of the disclosure, optimum disaggregation state vector S*($t_k$), indicates which appliances $D_n$ are ON and drawing power from meter 154 at time $t_k$ and which appliances $D_n$ are OFF and not drawing power from the meter at time $t_k$. Following determination of S*($t_k$), Power Daemon 120 may proceed to a block 222 to end procedure 200 for time $t_k$, and optionally increase k and return to block 204 to determine an optimum disaggregation state S*($t_{k+1}$) for house 20 at a time $t_{k+1}$.

It is noted that stopping criteria other than (i=I) may be used in block 218 to initiate ending procedure 200 for disaggregating $D_n$ at a time $t_k$, in accordance with an embodiment of the disclosure. For example, algorithm 200 may initiate ending if a minimum of $C_j$(S'(i,j,$t_k$)) changes by less than an amount smaller than a predetermined upper bound for a number of iterations i greater than or equal to a predetermined lower bound. Or, by way of an additional example, algorithm 200 may initiate ending if a difference between a minimum $C_j$(S'(i,j,$t_k$)) and a minimum of the cost function $C_j$(S'(i,j,$t_{k-1}$)) for which an optimum disaggregation state vector S*($t_{k-1}$) was determined for a previous time, such as time $t_{k-1}$, is less than a predetermined upper bound.

If on the other hand in decision block 218 Power Daemon 120 determines that index i is not equal to I, the Daemon may proceed to a block 224 and select a subset{S'(i,j',$t_k$)} of the set {S'(i,j,$t_k$)} of J trial disaggregation state vectors determined in block 212. Subset {S'(i,j',$t_k$)} may contain trial state vectors for which associated cost function values $C_j$(S'(i, j',$t_k$)) are in an "e-th" percentile of the J cost function values in the set {$C_j$(S'(i, j,$t_k$))}. That is, for any given $C_j$(S'(i, j',$t_k$)) in the subset, at least (1−∈)% of the cost function values in the set {$C_j$(S'(i, j,$t_k$))} are greater than the given $C_j$(S'(i, j',$t_k$)). By way of example, an e-th percentile may be equal to 15%, 10%, or 5%. Optionally, in a block 226, Power Daemon 120 determines a temporary trial probability T p'(i,$t_k$)$_{n,m}$, which may be determined in accordance with an expression $$Tp'(i,t_k)_{n,m} = \frac{\sum_{j'} s'(i,j',t_k)_{n,m}}{\sum_{j',n,m} s'(i,j',t_k)_{n,m}} \quad (16)$$

In expression (16) the sum in the numerator is equal a total number of times the trial value s'(i,j', $t_k$)$_{n,m}$ is equal to 1 in the selected subset {S'(i,j',$t_k$)} for the m-th appliance state of appliance $D_n$. The sum in the denominator is equal to a total number of times in the selected subset {S'(i,j',$t_k$)} that a trial value s'(i, j', $t_k$)$_{n,m}$ is equal to 1.

In a block 228 Power Daemon 120 may determine a new trial probability, NEW-p$_{n,m}$, $$NEW-p_{n,m}=\beta Tp'(i,t_k)_{n,m}+(1-\beta)p(i,t_k)_{n,m}, \quad (17)$$

where β is a number less than one. Power Daemon 120 may then proceed to a block 230 in which the Power Daemon increases i by 1, and in a block 232 determines a next iteration {p'(i)$_{n,m}$} of a set of trial probabilities $$\{p'(i)_{n,m}\}=\{NEW-p_{n,m}\}. \quad (18)$$

Power Daemon 120 may then proceed to block 210 to perform a next iteration for determining an optimum disaggregation state vector S(t) for appliances $D_n$.

In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment for an application for which the embodiment is intended. Wherever a general term in the disclosure is illustrated by reference to an example instance or a list of example instances, the instance or instances referred to, are by way of non-limiting example instances of the general term, and the general term is not intended to be limited to the specific example instance or instances referred to. Unless otherwise indicated, the word "or" in the description and claims is considered to be the inclusive "or" rather than the exclusive or, and indicates at least one of, or any combination of more than one of items it conjoins.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. An apparatus for disaggregating a plurality of aggregated electrical devices that receive power via a same power node, the apparatus comprising:
a memory having values of at least one power feature for each of the aggregated electrical devices that characterizes power consumption of the device; and
a processor comprising instructions executable to:
receive a measure of a value for the at least one power feature of node power distributed to the aggregated devices via the power node;
determine an optimum probability mass function (PMF) based on the values for the at least one power feature for each of the electrical devices that is optimized responsive to a cost function comprising a penalty function characterized by a Hamming distance to provide an optimum disaggregation state vector for the aggregated electrical devices that satisfies a predetermined criterion for providing a value for the at least one power feature, which agrees with the received measure of the at least one power feature; and
use the disaggregation state vector to monitor and determine ON/OFF states of the aggregated electrical devices.

2. The apparatus according to claim 1, wherein the cost function is a function of the measure of the at least one power feature of the node power and a trial value for the measure based on a trial disaggregation state provided by a trial PMF, and determining the optimum PMF comprises iterating the trial PMF to minimize the cost function.

3. The apparatus according to claim 2, wherein the cost function comprises an absolute difference between the measure of the at least one power feature of the node power and the trial value for the measure.

4. The apparatus according to claim 1, wherein the penalty function comprises a function of a trial disaggregation state vector for the aggregated devices based on the trial PMF, and an optimum disaggregation state vector of the aggregated devices determined for a time prior to a time for which the received measure is acquired.

5. The apparatus according to claim 4, wherein the penalty function comprises a function of a difference between the trial disaggregation state vector and the optimum disaggregation state vector for the prior time.

6. The apparatus according to claim 5, wherein the function of the difference comprises a function of a sum of weighted differences between components of the trial disaggregation state vector and corresponding components of the optimum disaggregation state vector.

7. The apparatus according to claim 5, wherein the function of the difference comprises a function of a difference between the measure of the at least one power feature of the node power and the trial value for the at least one power feature for the node power.

8. An apparatus for disaggregating a plurality of aggregated electrical devices that receive power via a same power node, the apparatus comprising:
a memory having values of at least one power feature for each of the aggregated electrical devices that characterizes power consumption of the device; and
a processor comprising instructions executable to:
receive a measure of a value for the at least one power feature of node power distributed to the aggregated devices via the power node;
determine a cost function based on the values for the at least one power feature for each of the electrical devices that is a function of the measure of the at least one power feature of the node power, a trial value for the measure based on a trial disaggregation state vector provided by a trial probability mass function (PMF), and a penalty function;
determine an optimum PMF responsive to the cost function in which the penalty function is weighted inversely by a time lapse between times for which the trial disaggregation state vector and a prior, optimum, disaggregation state vector are determined to provide an optimum disaggregation state vector for the aggregated electrical devices that satisfies a predetermined criterion for providing a value for the at least one power feature which agrees with the received measure of the at least one power feature; and
use the optimum disaggregation state vector to monitor and determine ON/OFF states of the aggregated electrical devices.

9. The apparatus according to claim 2, wherein the trial PMF is determined to satisfy the predetermined criterion and be the optimum PMF, if the trial PMF is a trial PMF of a last iteration of a predetermined number of iterations.

10. The apparatus according to claim 2, wherein the trial PMF is determined to satisfy the predetermined criterion and be the optimum PMF if a minimum of the cost function for the trial PMF changes by less than an amount smaller than a predetermined upper bound for a number of iterations greater than or equal to a predetermined lower bound.

11. The apparatus according to claim 10, wherein the upper bound for the amount is less than or equal to 10% of the minimum of a prior minimum cost function determined for a last iteration prior to the iteration for which the trial PMF is determined and the lower bound for the number of iterations is greater than or equal to 5.

12. The apparatus according to claim 2, wherein the trial PMF is determined to satisfy the predetermined criterion and be the optimum PMF if a difference between a minimum of the cost function for the trial PMF and a minimum of the cost function for an optimum disaggregation state vector determined for a time prior to a time for which the received measurement is acquired is less than a predetermined upper bound.

13. The apparatus according to claim 12, wherein the upper bound for the difference is less than or equal to 10% of the minimum of the cost function for an optimum disaggregation state vector determined for the prior time.

14. The apparatus according to claim 1, wherein the at least one power feature comprises at least one or any combination of more than one of electric current, apparent power (VA), real power (W), reactive power (VAR), power factor, total harmonic distortion (THD), total demand distortion, and/or an amplitude of a component of an integral transform of the power feature.

15. A method for monitoring which electrical devices of a plurality of aggregated electrical devices that receive power via a same power node, are On or OFF the method comprising:
receiving a measure of a value of at least one power feature of node power distributed to the aggregated devices via the power node;
determining a cost function that is a function of the measure of the at least one power feature of the node power, a trial value for the measure based on a trial disaggregation state vector provided by a trial probability mass function (PMF), and a penalty function;
determining an optimum PMF responsive to the cost function in which the penalty is weighted inversely by a time lapse between times for which the trial disaggregation state vector and a prior, optimum, disaggregation state vector are determined to provide an optimum disaggregation state vector for the aggregated electrical devices that satisfies a predetermined criterion for providing a value for the at least one power feature, which agrees with the received measure of the at least one power feature; and
and using the optimum disaggregation state vector to monitor the electrical devices and determine which of the electrical device are ON or OFF.

16. The method according to claim 15 wherein determining the optimum PMF comprises iterating a trial PMF to minimize a cost function that is a function of the measure of the at least one power feature of the node power and a trial value for the measure based on a trial disaggregation state provided by the trial PMF.

17. The method according to claim 16 wherein he cost function comprises a penalty function and increases with increase in magnitude of the penalty function.

* * * * *